United States Patent
Lan et al.

[19]

[11] Patent Number: 6,034,569
[45] Date of Patent: Mar. 7, 2000

[54] AMPLIFIER OFFSET CANCELLATION SYSTEM

[75] Inventors: Ing-Jye Lan; Brian N. Kuo, both of Saratoga, Calif.

[73] Assignee: Capella Microsystems, Inc., Santa Clara, Calif.

[21] Appl. No.: 09/096,135

[22] Filed: Jun. 11, 1998

[51] Int. Cl.[7] .............................. H03F 1/30; H03F 1/02; H03L 5/00

[52] U.S. Cl. .................. 330/290; 330/9; 327/307

[58] Field of Search .................. 330/2, 9, 290; 327/307

[56] References Cited

U.S. PATENT DOCUMENTS 4,730,294  3/1988  Funada .
4,833,418  5/1989  Quintus et al. ........................... 330/9
5,061,900  10/1991 Vinn et al. ............................... 330/9

*Primary Examiner*—Robert Pascal
*Assistant Examiner*—Patricia T. Nguyen
*Attorney, Agent, or Firm*—Majestic, Parsons, Siebert & Hsue P.C.

[57] ABSTRACT

The DC level of the output of an amplifier may be dynamically adjusted depending on the operating conditions of the amplifier by comparing the output of the amplifier to a set reference value using a comparator. The output of the comparator is then fed to a state machine which adjusts the DC level of the amplifier output in an autocalibration process until the DC level of the output of the amplifier is substantially equal to the reference value. An undervoltage lockout circuit detects a power supply to the amplifier and causes the calibration to be initiated only when the power supply meets certain requirements. A change in the gain setting in the amplifier is also detected for automatically initiating the calibration process.

28 Claims, 6 Drawing Sheets

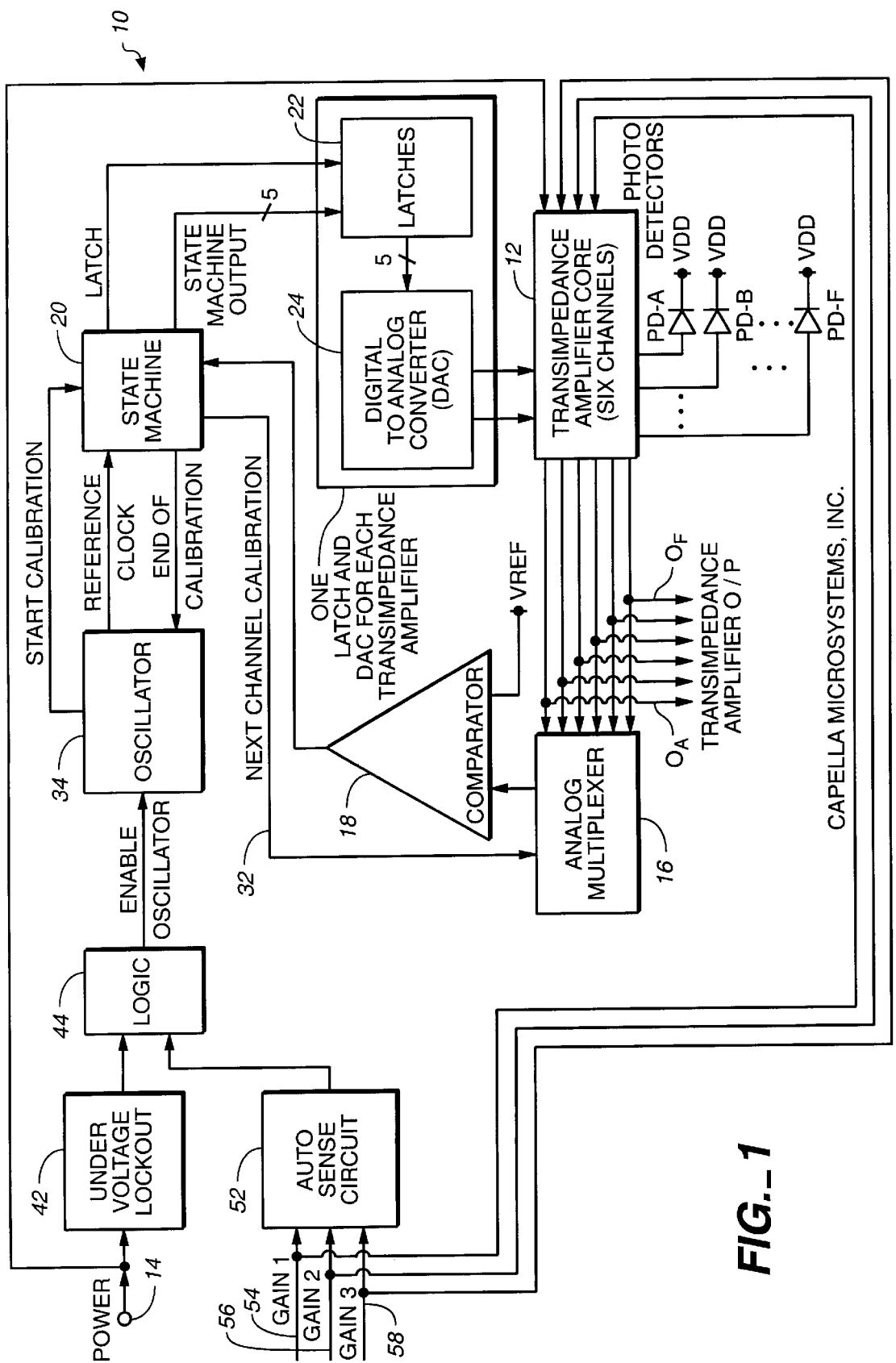
FIG._1

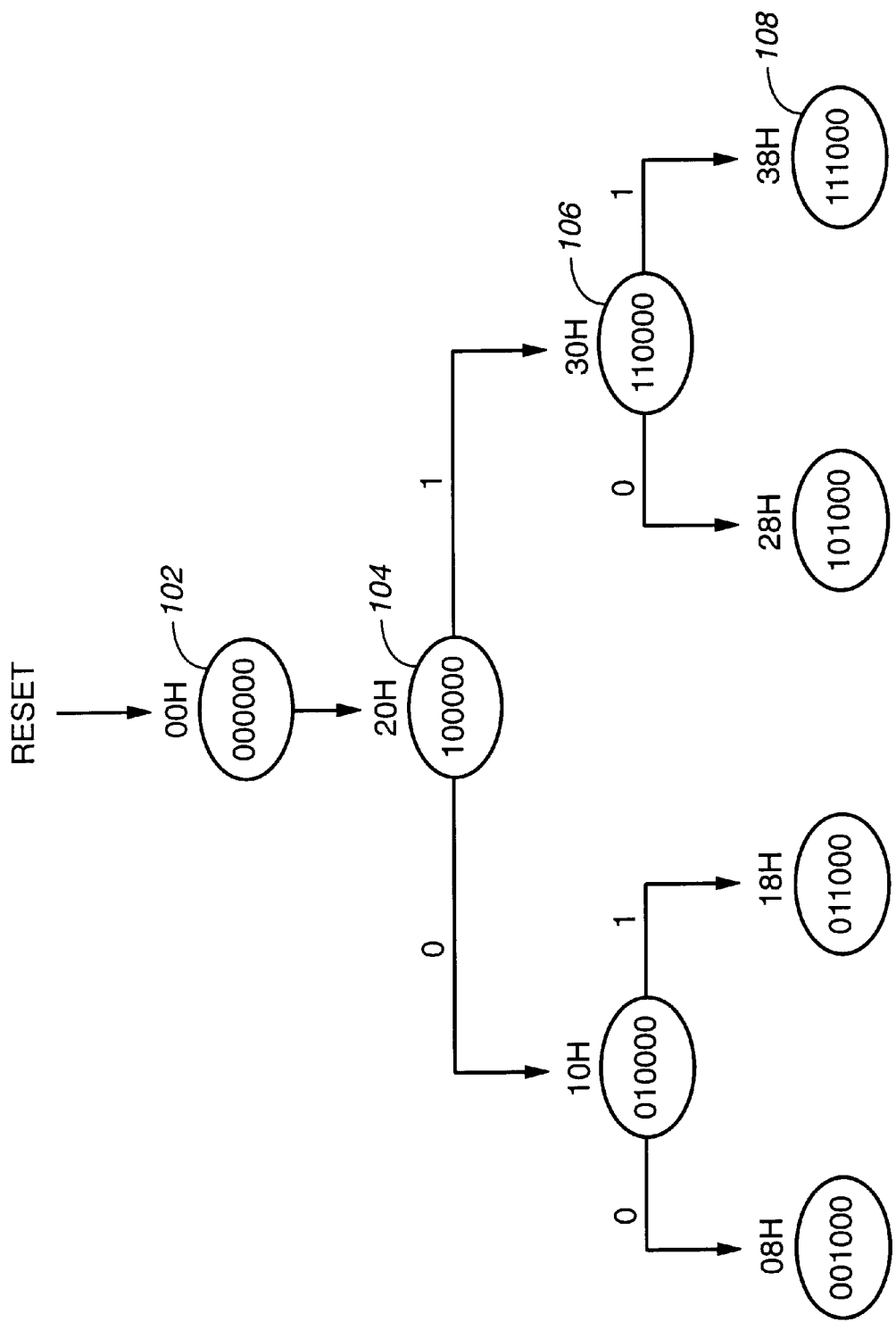
FIG._2

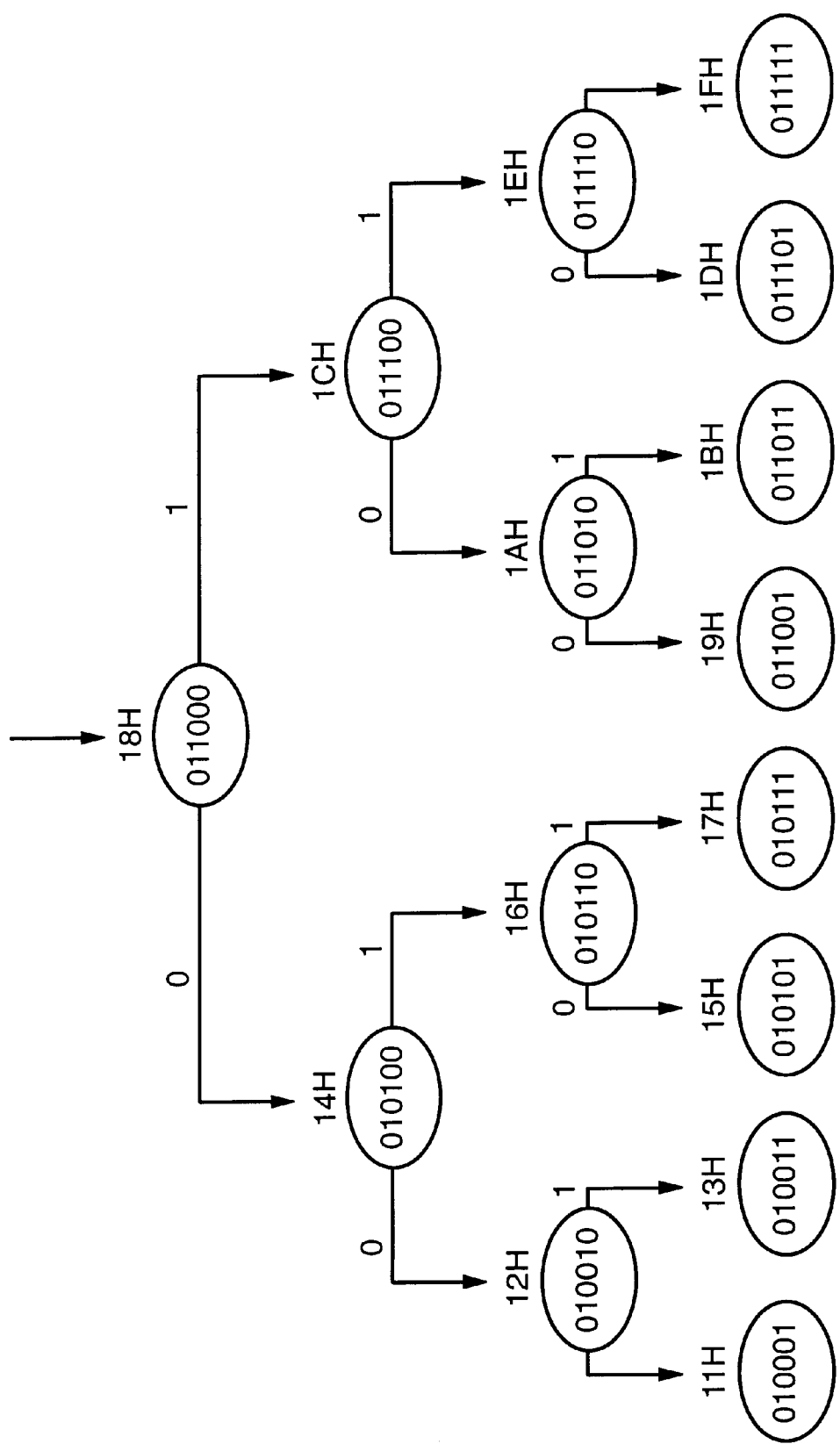
FIG._3

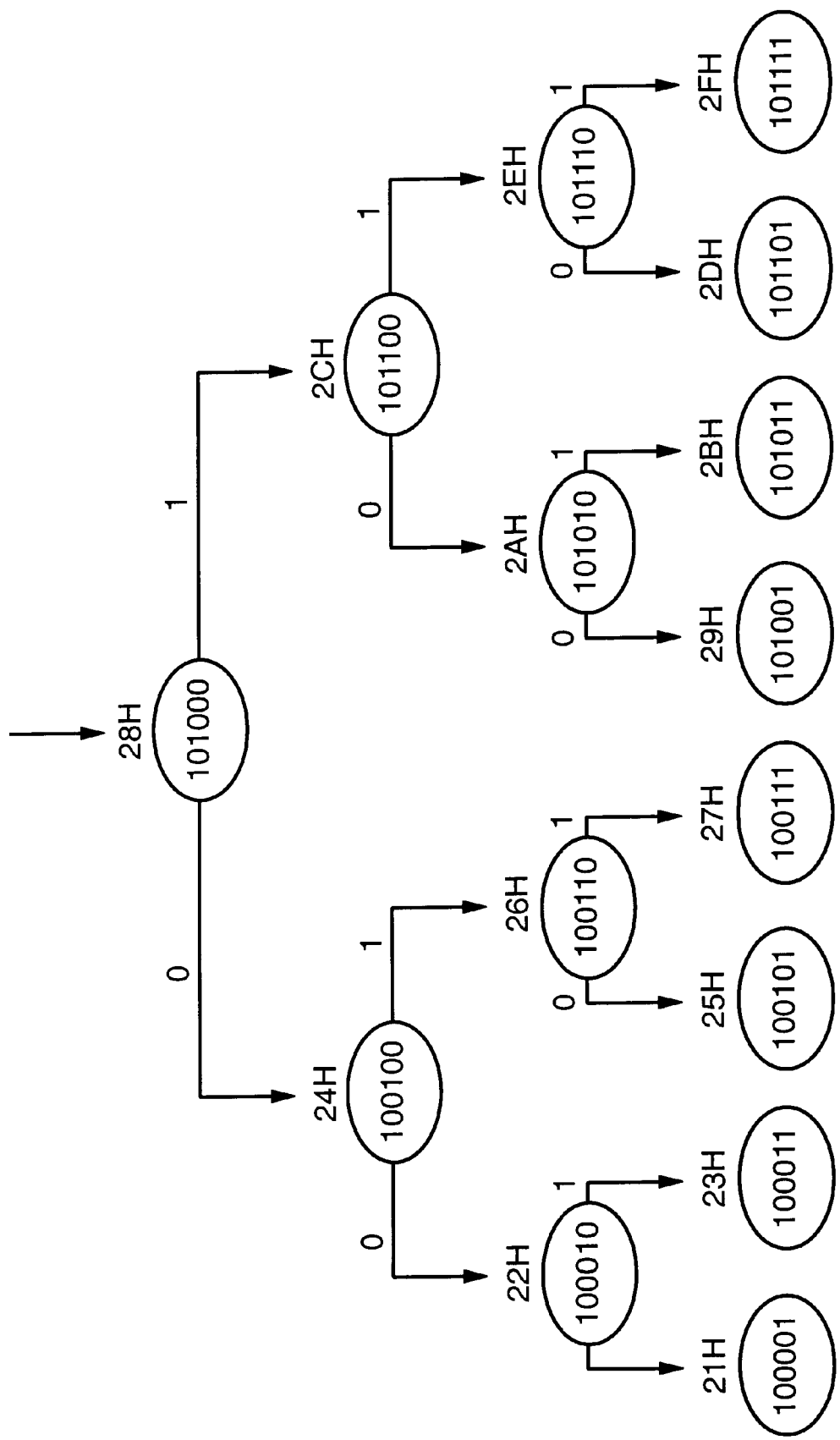
FIG._4

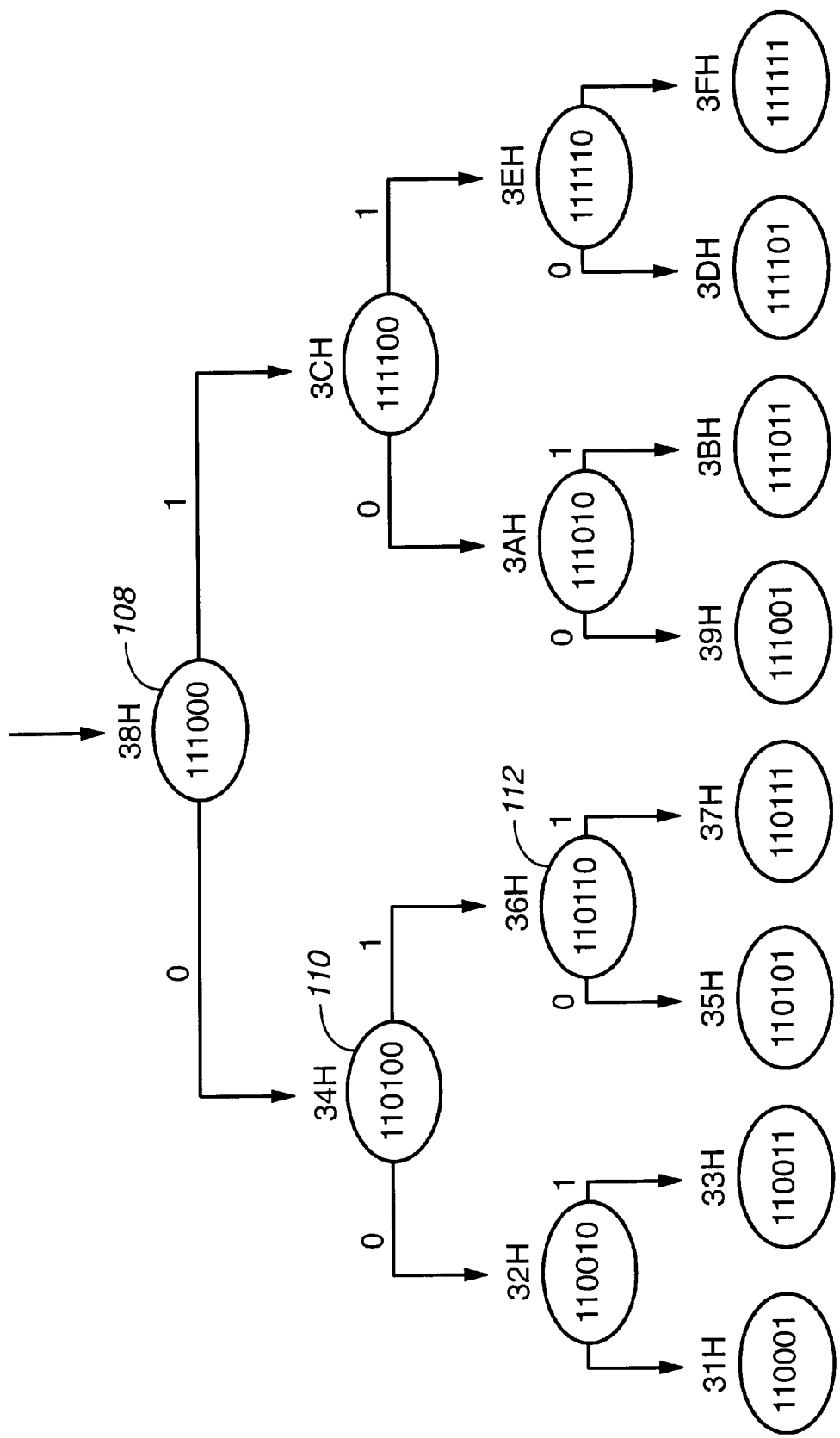
FIG._5

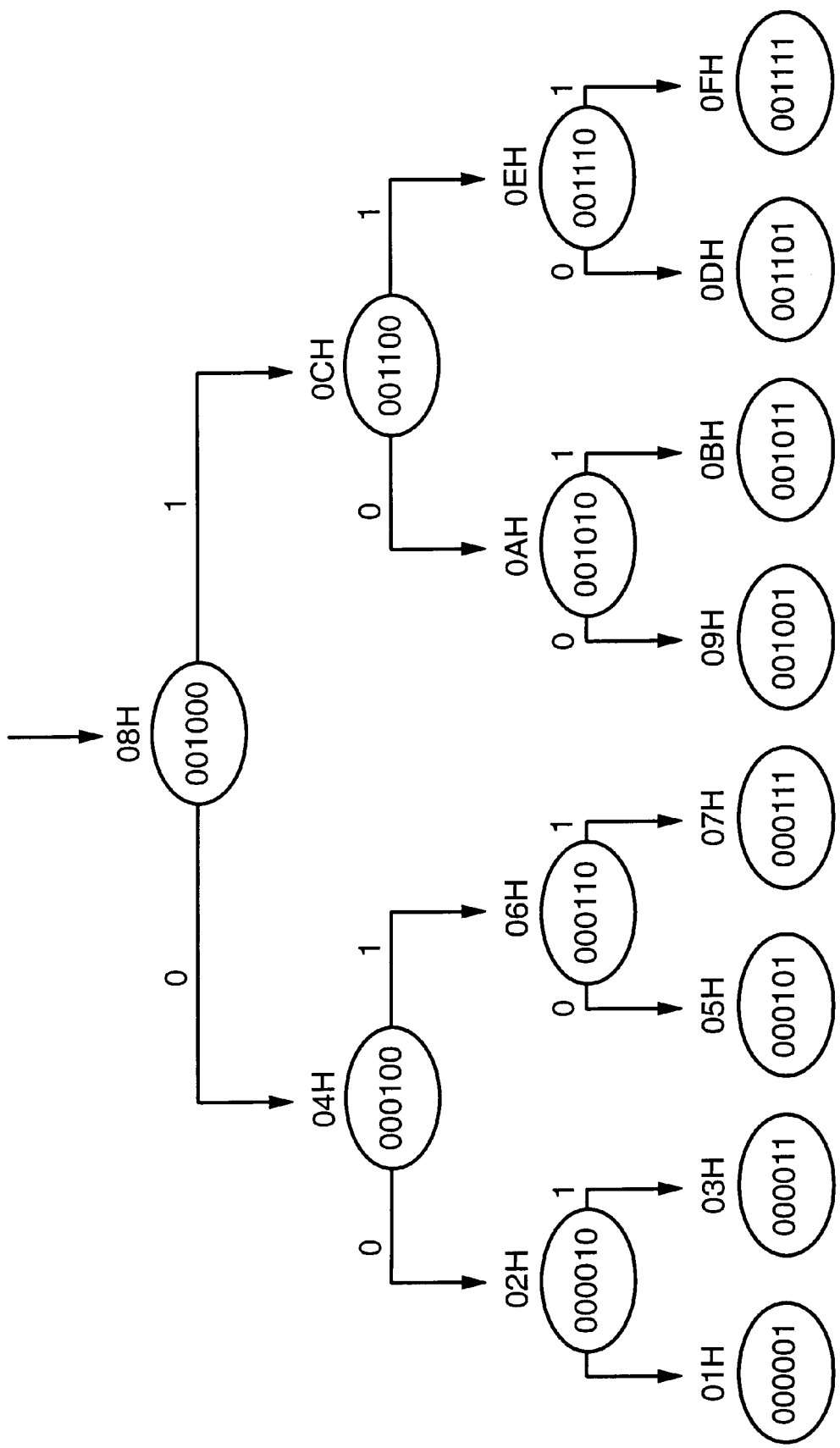
FIG._6

6,034,569

AMPLIFIER OFFSET CANCELLATION SYSTEM

BACKGROUND OF THE INVENTION

This invention relates to a system for cancelling offsets in amplifiers. The invention is particularly useful for conditioning a transducer signal.

In Digital Versatile Disc (DVD) and Compact Disc-Read Only Memory (CD-ROM), a photodetector is used for reading information from a disc. The photodetector output current is typically amplified by an amplifier before it is sent to the next stage. "Amplifier offset" is defined as the difference between the DC level of the amplifier output and a reference voltage when no signal (from the photodetector) is applied to the amplifier. Due to the "unipolar" characteristics of the photodetector output current, conventional auto-zeroing circuit may not be used to optimize the amplified output. In existing systems, the amplifier offset is optimized during the wafer sort stage in integrated circuit fabrication by means of a trimming scheme. The integrated circuits for the DVD/CD-ROM systems employ polysilicon or metal fuses. The DC level of the amplifier outputs in such systems are set by applying a high trimming current to burn one or more fuses.

Thus, in a conventional trimming scheme for cancelling the amplifier offset, the cancellation may only be performed once, since after the optimization by burning one or more fuses, the DC level of the amplifier output can no longer be changed. Since different operating conditions may result in different amplifier output DC levels, the above-described conventional trimming scheme is quite limited, since the DC level of the amplifier output cannot be changed with the operating conditions. Thus, the operating conditions may change as a function of the gain setting of the amplifier, the condition of the power supply voltage and temperature, as well as backward or forward compatibility to other devices downstream or upstream in the signal path from the amplifier.

The requirement of the trimming step during the wafer sort stage will add additional testing costs due to the extra testing time required. Moreover, the application of a high trimming current to burn a fuse may, in some situations, affect product reliability. It is, therefore, desirable to provide an improved system for offset optimization where the above-described drawbacks are alleviated or eliminated.

SUMMARY OF THE INVENTION

One aspect of the invention is directed towards an apparatus for cancelling offsets in amplifiers, comprising a comparator comparing an output of at least one amplifier to a reference, where no external signal is applied to the at least one amplifier, to provide an output; and means responsive to the comparator output for generating a correction signal applied to the at least one amplifier to adjust DC level of the output of the at least one amplifier until the DC level is essentially equal to the reference.

Another aspect of the invention is directed towards a method for cancelling offsets in amplifiers, comprising comparing an output of at least one amplifier to a reference, where no external signal is applied to the at least one amplifier, to provide a comparison output; and generating, in response to the comparison output, a correction signal and applying the correction signal to the at least one amplifier to adjust the DC level of the output of the at least one amplifier until the DC level is substantially equal to the reference.

One more aspect of the invention is directed towards an apparatus for conditioning a transducer signal, comprising at least one amplifier for conditioning the transducer signal, said at least one amplifier having an output; comparator means for comparing the output of the at least one amplifier to a reference, where no external signal is applied to the at least one amplifier, to provide an output; and means responsive to the comparator output for generating a correction signal and applying it to the at least one amplifier to adjust the DC level of the output of the at least one amplifier until the DC level is substantially equal to the reference.

Yet another aspect of the invention is directed towards a method for conditioning a transducer signal, comprising comparing an output of at least one amplifier to a reference, when no external signal is applied to the at least one amplifier, to provide a comparison output; generating, in response to the comparison output, a correction signal and applying the correction signal to the at least one amplifier to adjust the DC level of the output of the at least one amplifier until the DC level is substantially equal to the reference; and amplifying the transducer signal by means of said at least one amplifier.

BRIEF DESCRIPTION OF THE DRAWINGS

FIG. 1 is a block diagram of a system for cancelling offsets in amplifiers to illustrate the preferred embodiment of the invention.

FIGS. 2–6 are flow charts illustrating the operation of the state machine in the system of FIG. 1 to illustrate the preferred embodiment of the invention.

DETAILED DESCRIPTION OF THE PREFERRED EMBODIMENT

FIG. 1 is a block diagram of a system for cancelling offsets of transimpedence amplifiers for six channels to illustrate the preferred embodiment of the invention. In each of the six channels (A, B, C, D, E, F), a corresponding photodetector, such as photodetector PD-A for channel A, provides a current to a transimpedence amplifier core 12 also having six channels to be amplified, before the amplified output $O_A$ for channel A is provided to the next stage of the system (not shown). Similarly, amplifier core 12 amplifies the output of the other five photodetectors PD-B through PD-F and provides, together with $O_A$, a total of six outputs ($O_A, O_B, \ldots O_F$).

The DC level of the output of amplifier core 12 for each of the six channels may change depending on the gain setting, power supply voltage applied to amplifier core 12 from power terminal 14, temperature and other factors. Also, for backward compatibility with existing compact disc-audio, CD-ROM, CD-R, and CD-RW as well as forward compatibility with DVD-RAM, it is desirable to be able to adjust the DC level of the output of amplifier core 12 for each of the six channels on an as needed basis, or periodically. This is not possible with the conventional technique of trimming, which can only be performed once, after which the DC level of the amplifier output can no longer be changed.

For this purpose, the six outputs $O_A, \ldots O_F$ are selected by an analog multiplexer 16, one at a time, for comparison by comparator 18. Comparator 18 compares each of the six selected outputs of amplifier core 12 to a voltage reference VREF, when the photodetector is applying no signal to the core 12, so that the output of each of the channels is a DC level. Comparator 18 then supplies a comparison output signal to state machine 20. For example, the comparator compares output $O_A$ to the voltage reference. In response to the comparison output or signal, state machine 20 provides an output, which in the preferred embodiment is a five bit binary output, to a corresponding set among six sets of latches 22, where each set includes 5 latches, each latch storing one bit. Such corresponding set of latches (corresponding to output $O_A$) stores the 5 bit state machine output for adjusting the DC level of the amplifier core output to yield output $O_A$. The stored value is converted by one of six corresponding digital to analog converters 24 into an analog signal and this analog signal is applied to transimpedence amplifier core 12 for adjusting the DC level of the output of the particular channel amplifier core that gives output $O_A$. The above process is applied when the photodetector PD-A (or any other device external to the offset cancellation apparatus) of the channel A is not applying any signals to the amplifier core 12 for such channel, so that the difference between the reference value VREF and the output (a DC level) of the amplifier core 12 for such channel is the offset. After the offset adjustment, the amplifier core for such channel would provide a new output $O_A'$. The new output $O_A'$ of amplifier core 12 for such channel is again compared by comparator 18 to the voltage reference and the updated comparison output of comparator 18 is used by state machine 20 to provide an updated output for further adjustment of the DC level of the output of the amplifier core 12 for such channel to provide yet another updated output. This process is repeated until the DC level of the output of the amplifier core for such channel is substantially the same as the voltage reference VREF, at which point the state machine applies a next channel calibration signal along path 32 to analog multiplexer 16, causing the multiplexer to select a different output channel of amplifier core 12 than channel A for calibration.

The above-described process is then carried out for the remaining five channels so that offsets are adjusted until the DC levels of the outputs of all of the six channels in amplifier core 12 are substantially equal to the voltage reference VREF.

The state machine 20 is operated by means of a reference clock from an oscillator 34. After the DC level of the outputs of all channels in amplifier core 12 have been calibrated as described above, state machine 20 sends an end of calibration signal to oscillator 34, causing oscillator 34 to go into a "sleep mode." By shutting off the oscillator after the completion of the autocalibration process, any reference clock related glitch and/or noise will be eliminated and the performance of the low noise transimpedence amplifier 12 will be enhanced.

System 10 may form a part of a typical DVD/CD-ROM head amplifier. When power is first turned on to such typical head amplifier, system 10 will initiate a calibration process for adjusting the offsets of amplifier core 12. However, when power is first turned on, the voltage level applied may be unsteady. If the above-described autocalibration process is carried out when the power supply voltage is still fluctuating, or not at the right voltage, the calibration results may be invalid. To prevent this from happening, an under voltage lock out circuit 42 is employed which senses the power supplied to amplifier core 12. If the voltage level at terminal 14 is still unsteady or at the wrong voltage level, circuit 42 will not generate an enable signal to enable oscillator 34. But if circuit 42 senses that the voltage at terminal 14 is at the proper level or state, circuit 42 will generate an enable signal through logic 44 to oscillator 34, causing oscillator 34 to generate a reference clock for state machine 20, thereby causing state machine 20 to start to operate.

The gain of the amplifier core 12 may be altered after the DVD/CD-ROM head amplifier has been operating. Even if the DC levels of the outputs for the different channels of amplifier core 12 were at the proper values prior to the gain change, after the change in gain, the DC level of the outputs of these channels may be off from desired values, so that it is desirable to repeat the calibration process after an alteration in gain of the amplifier core 12. For this purpose, an autosense circuit 52 senses a change in the gain at terminals 54, 56, 58. When circuit 52 senses that there is a change in gain, it applies an enable signal through logic 44 to oscillator 34, causing the oscillator to generate a reference clock to initiate the operation of the state machine 20. State machine 20 will then operate in the manner described above in conjunction with multiplexer 16, comparator 18, latches 22 and converters 24 to perform the autocalibration as described above. The construction of the under voltage lockout circuit 42 and of the autosense circuit 52 may be of conventional design and will not be described in detail here. Logic 44 may simply be an OR-gate.

In the preferred embodiment, state machine 20 is used to more accurately calibrate the DC levels of the output of the different channels in amplifier core 12; it will be understood that other circuits may be used instead and are within the scope of the invention.

The operation of state machine 20 in the calibration process will now be described in reference to FIGS. 2–6. State machine 20 operates by a process of successive approximation. In reference to FIG. 2, state machine 20 detects whether the comparator 18 output is positive or negative. A positive comparator output indicates that the DC level output (referred to below simply as "output") of the particular amplifier channel being calibrated is lower than VREF so that it should be increased whereas a negative comparator output indicates that the output of the particular amplifier channel being calibrated is at a higher voltage level compared to VREF so that it should be lowered. First the state machine 20 is reset to all zeros.

In the preferred embodiment illustrated in FIGS. 2–6, the state machine 20 has a six bits resolution. Thus, all six bits of the state machine are initially reset to "0" as shown in block 102. The statuses of the bits of state machine 20 are indicated within the ellipses in FIGS. 2–6, where the hexadecimal equivalent state of such binary states are indicated immediately on top of the corresponding ellipse. Thus, as shown in and near ellipse 102, the initial state of the state machine 20 is all zeros, or 00H in hexadecimal. If the comparator output is positive, the most significant bit is set to a "1", indicating that the amplifier core output for the channel needs to be increased; whereas if the output of the comparator is negative, indicating that such output needs to be decreased, a "0" is indicated for the most significant bit (MSB). Therefore, even though initially and temporarily, the MSB is set to a "1" in ellipse 104, a detection of the comparator output will cause the MSB to be changed to "0" if the comparator output is negative and to remain "1" if the comparator output is positive.

For the purpose of illustration, it is assumed that the output of a particular channel of amplifier core 12 being calibrated is at 1.8 volts whereas VREF is at 2.5 volts. Thus, the comparator output will be positive and the MSB will remain a "1." State machine 20 proceeds to ellipse 106 and automatically sets the next or second MSB bit to a "1" as shown in ellipse 106. The state machine now must test to see if the next or the second MSB bit should be a "1" or a "0." For this purpose, the state machine sends five bits, that is all six bits except for the MSB, to the corresponding latches 22. In other words, in the particular example here, the binary value "10000" is sent to latches 22. This digital value is then converted by convertor 24 into an analog voltage value and applied to the particular channel being calibrated in amplifier core 12. Convertor 24 may be controlled to select the proper voltage steps. In this example, it is assumed that a binary value of "10000" is converted to 0.5 volts by the convertor, and this step would apply a 0.5 volt adjustment. Thus a "10000" binary value translates into adding a 0.5 volts to the output, resulting in an output of the channel of 2.3 volts.

Such 2.3 volts output passes through multiplexer 16 to comparator 18 which detects that such output is still lower than VREF of 2.5 volts. This confirms the correctness of adding the 0.5 volts in ellipse 106 so that the "1" value of the next or second most significant bit is retained and the state machine proceeds to ellipse 108 to set the next or third most significant bit to a "1", so that ellipse 108 now contains "111000." The output of state machine 20 is therefore "11000" which is applied to latches 22. This latched binary value translates to a 0.75 volts and the convertor 24 adds a 0.75 volts adjustment to the output of 1.8 volts of the channel being calibrated, resulting in a 2.55 volts output. Comparator 18 detects that such output would be greater than VREF of 2.5 volts, so that the third most significant bit of the state machine 20 is changed from a "1" to a "0". This is shown in FIG. 5 where the state machine 20 then proceeds to ellipse 110 and the next or the fourth most significant bit is set to a "1", so that ellipse 110 now contains the value "1 10100" and the binary value "10100" is applied to latches 22. This value is converted by convertor 24 to 0.625 volts which is added to the 1.8 volt output of the channel calibrated, resulting in an output of 2.425 volts which is less than VREF. This means that the fourth most significant bit should retain the value "1" and state machine 20 proceeds to ellipse 112 and so on until all six bits of the state machine are determined. At this point, the DC level of the output of the channel being calibrated has been adjusted to be as close to VREF as permitted by the resolution of the state machine.

The state machine then causes the multiplexer 16 to select another channel for calibration unless all the channels have been calibrated. Thus, the latches corresponding to the channel just calibrated will store the value arrived at by the state machine which in turn, causes convertor 24 to apply the appropriate voltage correction to the channel being calibrated in order to adjust the output to the desired value VREF. In this manner, the six sets of latches and the six converters together apply the desired voltage corrections to their corresponding amplifier channels so that these channels have minimal offsets.

While in the preferred embodiment, state machine 20 employs six bits, it will be understood that state machine 20 may employ more bits for a more accurate offset adjustment or fewer bits to speed up the calibration process; such and other variations are within the scope of the invention. The conversion of the digital values to analog voltages may be selected to be different from the example used above; such variations are within the scope of the invention.

While the embodiment above has been illustrated in reference to an amplifier core and corresponding digital to analog convertors and six sets of latches for six channels, it will be understood that any number of channels may be employed and are within the scope of the invention. While in the embodiment described, the amplifier core 12 is used for amplifying signals from photodetectors for devices such as DVD and CD-ROM, it will be understood that the amplifier core 12 may be used for applying signals from magnetic heads in hard disk drives, or from other transducers, such as those in other mass storage systems and communication systems. In such event, the photodetectors in FIG. 1 would be simply replaced by magnetic heads or other transducers; in such cases, no signals are applied by external devices such as these heads or transducers during the calibration process. Amplifier core 12 in the above embodiment converts current to a voltage. It will be understood that the same calibration scheme may be applied to amplifiers which convert voltage to voltage, voltage to current or current to current as well.

While the invention has been described by reference to preferred embodiments, it will be understood that various changes and modifications may be made without departing from the scope of the invention which is to be defined only by the appended claims and their equivalents.

What is claimed is:

1. An apparatus for cancelling offsets in amplifiers, comprising:

a comparator comparing an output of at least one amplifier to a reference, when no external signal is applied to the at least one amplifier, to provide an output; and a circuit including a state machine that generates a correction signal applied to the at least one amplifier to adjust DC level of an output of the at least one amplifier in response to the comparator output until the DC level is substantially equal to the reference.

2. The apparatus of claim 1, said circuit including an oscillator supplying a clock signal to operate the state machine, said state machine instructing the oscillator to stop when it senses from the comparator output that the DC level is substantially equal to the reference.

3. The apparatus of claim 2, said comparator comparing an output of each of a plurality of amplifiers to said reference, said state machine instructing the oscillator to stop when it senses from the comparator output that the DC level of the output of each of said plurality of amplifiers is substantially equal to the reference.

4. The apparatus of claim 1, said circuit further including a latch latching an output of the state machine, a digital to analog converter converting said latched output into an analog signal and means for supplying the analog signal to the at least one amplifier.

5. The apparatus of claim 1, further comprising a sensing circuit for sensing a change in gain of the at least one amplifier, said sensing circuit triggering the circuit including the state machine to generate a correction signal when a change in gain is sensed.

6. The apparatus of claim 5, said circuit including the state machine and an oscillator, said sensing circuit triggering the oscillator to provide a clock signal to the state machine to start the state machine.

7. The apparatus of claim 1, further comprising an underlock voltage lockout circuit that prevents the adjustment of the DC level when the underlock voltage lockout circuit senses that a voltage supplied to the at least one amplifier is under a predetermined threshold.

8. The apparatus of claim 7, wherein said underlock voltage lockout circuit prevents the adjustment of the DC level by preventing the generating means from generating a correction signal.

9. A method for cancelling offsets in amplifiers, comprising:

comparing an output of at least one amplifier to a reference, when no external signal is applied to the at least one amplifier, to provide a comparison output; and causing a state machine to generate, in response to the comparison output, a correction signal and applying the correction signal to the at least one amplifier to adjust DC level of the output of the at least one amplifier until the DC level is substantially equal to the reference.

10. The method of claim 9, further comprising sensing a change in gain of the at least one amplifier, and triggering the generation of a correction signal when a change in gain is sensed.

11. The method of claim 9, further comprising detecting whether a voltage supplied to the at least one amplifier is under a predetermined threshold, and preventing the adjustment of the DC level when said voltage is under the predetermined threshold.

12. An apparatus for providing and conditioning a transducer signal, comprising:

a transducer providing a transducer signal in response to a stimulus;

at least one amplifier for conditioning the transducer signal, said at least one amplifier having an output;

comparator means for comparing the output of the at least one amplifier to a reference, when no external signal is applied to the at least one amplifier, to provide an output; and a circuit including a state machine that is responsive to the comparator output and that generates a correction signal applied to the at least one amplifier to adjust DC level of the output of the at least one amplifier until the DC level is substantially equal to the reference.

13. The apparatus of claim 12, said circuit including an oscillator supplying a clock signal to operate the state machine, said state machine instructing the oscillator to stop when it senses from the comparator output that the output of the at least one amplifier is substantially equal to the reference.

14. The apparatus of claim 13, said comparator comparing an output of each of a plurality of amplifiers to said reference, said state machine instructing the oscillator to stop when it senses from the comparator output that the DC level of the output of each of said plurality of amplifiers is substantially equal to the reference.

15. The apparatus of claim 12, said circuit further including a latch latching an output of the state machine, a digital to analog converter converting said latched output into an analog signal, and means for supplying the analog signal to the at least one amplifier.

16. The apparatus of claim 12, further comprising a sensing circuit for sensing a change in gain of the at least one amplifier, said sensing circuit triggering the circuit to generate a correction signal when a change in gain is sensed.

17. The apparatus of claim 16, said circuit including an oscillator, said sensing circuit triggering the oscillator to provide a clock signal to the state machine to start the state machine.

18. The apparatus of claim 12, further comprising an underlock voltage lockout circuit that prevents the adjustment of the DC level when the underlock voltage lockout circuit senses that a voltage supplied to the at least one amplifier is under a predetermined threshold.

19. The apparatus of claim 18, wherein said underlock voltage lockout circuit prevents the adjustment of the DC level by preventing the generating means from generating a correction signal.

20. A method for providing and conditioning a transducer signal, comprising:

providing a transducer signal;

comparing an output of at least one amplifier to a reference, when no external signal is applied to the at least one amplifier, to provide a comparison output;

causing a state machine to generate, in response to the comparison output, a correction signal and applying the correction signal to the at least one amplifier to adjust the output of the at least one amplifier until DC level of the output is substantially equal to the reference; and amplifying the transducer signal by means of said at least one amplifier.

21. The method of claim 20, further comprising sensing a change in gain of the at least one amplifier, and triggering the generation of a correction signal when a change in gain is sensed.

22. The method of claim 20, further comprising detecting whether a voltage supplied to the at least one amplifier is under a predetermined threshold, and preventing the adjustment of the DC level when said voltage is under the predetermined threshold.

23. The apparatus of claim 12, said transducer being a photodetector.

24. The method of claim 20, wherein said providing provides an electrical signal in response to a radiation stimulus.

25. An apparatus for providing and conditioning a transducer signal, comprising:

a transducer providing a transducer signal in response to a stimulus;

at least one amplifier for conditioning the transducer signal, said at least one amplifier having an output;

comparator means for comparing the output of the at least one amplifier to a reference, when no external signal is applied to the at least one amplifier, to provide an output; and a circuit that is responsive to the comparator output and that generates a correction signal applied to the at least one amplifier to adjust DC level of the output of the at least one amplifier until the DC level is substantially equal to the reference.

26. The apparatus of claim 25, said transducer being a photodetector.

27. A method for providing and conditioning a transducer signal, comprising:

providing a transducer signal in response to a stimulus;

conditioning the transducer signal using at least one amplifier, said at least one amplifier having an output;

comparing the output of the at least one amplifier to a reference, when no external signal is applied to the at least one amplifier, to provide an output; and generating a correction signal in response to the output and applying the correction signal to the at least one amplifier to adjust DC level of the output of the at least one amplifier until the DC level is substantially equal to the reference.

28. The method of claim 27, wherein said providing provides the transducer signal wherein said providing provides an electrical signal in response to a radiation stimulus.

* * * * *